(12) United States Patent
Yoda et al.

(10) Patent No.: US 9,046,666 B2
(45) Date of Patent: Jun. 2, 2015

(54) OPTICAL MODULE AND METHOD FOR FABRICATING OPTICAL MODULE

(71) Applicant: CITIZEN HOLDINGS CO., LTD., Tokyo (JP)

(72) Inventors: Kaoru Yoda, Nagano (JP); Kazuhiro Toriumi, Nagano (JP)

(73) Assignee: CITIZEN HOLDINGS CO., LTD., Tokyo (JP)

( * ) Notice: Subject to any disclaimer, the term of this patent is extended or adjusted under 35 U.S.C. 154(b) by 175 days.

(21) Appl. No.: 13/920,102

(22) Filed: Jun. 18, 2013

(65) Prior Publication Data

US 2013/0336614 A1 Dec. 19, 2013

(30) Foreign Application Priority Data

Jun. 18, 2012 (JP) ................................ 2012-137219

(51) Int. Cl.
| | | |
|---|---|---|
| *G02B 6/42* | (2006.01) | |
| *G02B 6/36* | (2006.01) | |
| *G02F 1/355* | (2006.01) | |
| *G02F 1/35* | (2006.01) | |
| *H01S 5/00* | (2006.01) | |

(52) U.S. Cl.
CPC .............. *G02B 6/423* (2013.01); *G02B 6/3652* (2013.01); *G02B 6/4202* (2013.01); *G02F 1/3558* (2013.01); *G02F 2001/3503* (2013.01); *G02F 2001/3505* (2013.01); *G02F 2201/02* (2013.01); *G02F 2202/20* (2013.01); *H01S 5/0092* (2013.01)

(58) Field of Classification Search
CPC .... G02B 6/3562; G02B 6/424; G02B 6/4242; G02B 6/4243
See application file for complete search history.

(56) References Cited

U.S. PATENT DOCUMENTS

| | | | | |
|---|---|---|---|---|
| 4,702,547 | A * | 10/1987 | Enochs ............................ | 385/88 |
| 4,750,799 | A * | 6/1988 | Kawachi et al. ................ | 385/14 |
| 5,671,315 | A * | 9/1997 | Tabuchi et al. ................ | 385/137 |
| 5,784,509 | A * | 7/1998 | Yamane et al. ................. | 385/49 |
| 5,793,914 | A * | 8/1998 | Sasaki ............................. | 385/49 |
| 6,124,080 | A * | 9/2000 | Mizuta et al. ................. | 430/321 |
| 6,130,444 | A * | 10/2000 | Hashizume et al. ............ | 257/81 |
| 6,181,854 | B1 * | 1/2001 | Kojima et al. .................. | 385/49 |
| 6,797,989 | B2 * | 9/2004 | Bendelli et al. ................. | 257/99 |
| 7,255,491 | B2 * | 8/2007 | Takagi ............................ | 385/88 |
| 7,298,953 | B2 * | 11/2007 | Loni et al. ..................... | 385/137 |
| 2013/0022323 | A1* | 1/2013 | Takizawa et al. .............. | 385/92 |
| 2014/0348463 | A1* | 11/2014 | Ide et al. ......................... | 385/14 |

FOREIGN PATENT DOCUMENTS

JP 2002-107508 A 4/2002

* cited by examiner

*Primary Examiner* — Michelle R Connelly

(57) ABSTRACT

An optical module and a fabrication method thereof, the optical module includes a sub-substrate which includes a support layer, an active layer, a BOX layer interposed between the support layer and the active layer, and a height adjusting layer, an optical fiber, and an optical device which is fixed to a silicon substrate, wherein the sub-substrate includes a fixing groove formed by the active layer and the BOX layer, the optical fiber is fixed to the fixing groove, and the optical fiber is optically coupled to the optical device by positioning the sub-substrate via the height adjusting layer with respect to the silicon substrate.

4 Claims, 8 Drawing Sheets

FIG. 4
(a)
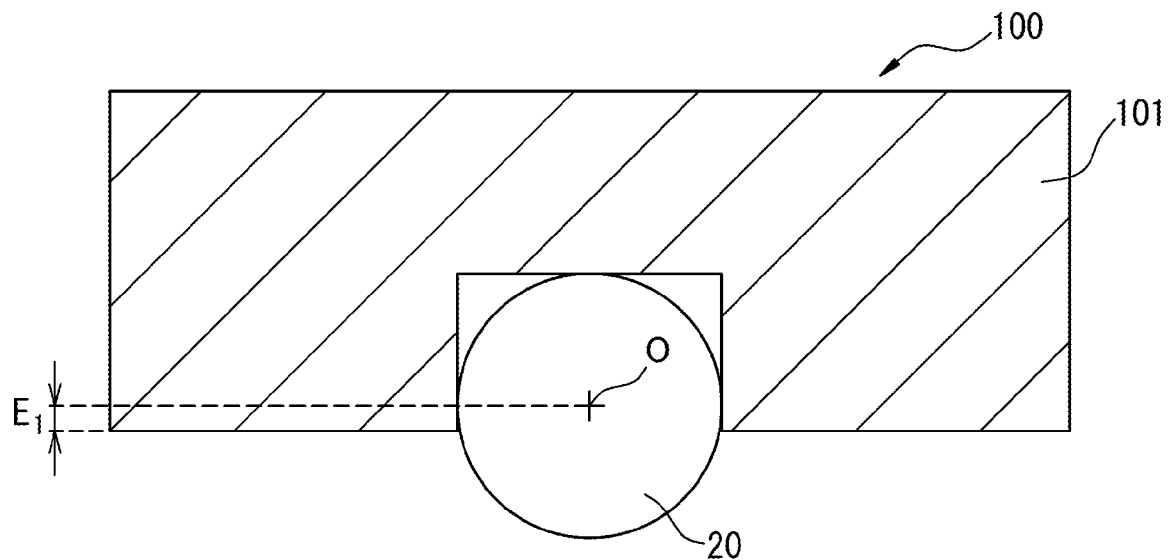
(b)
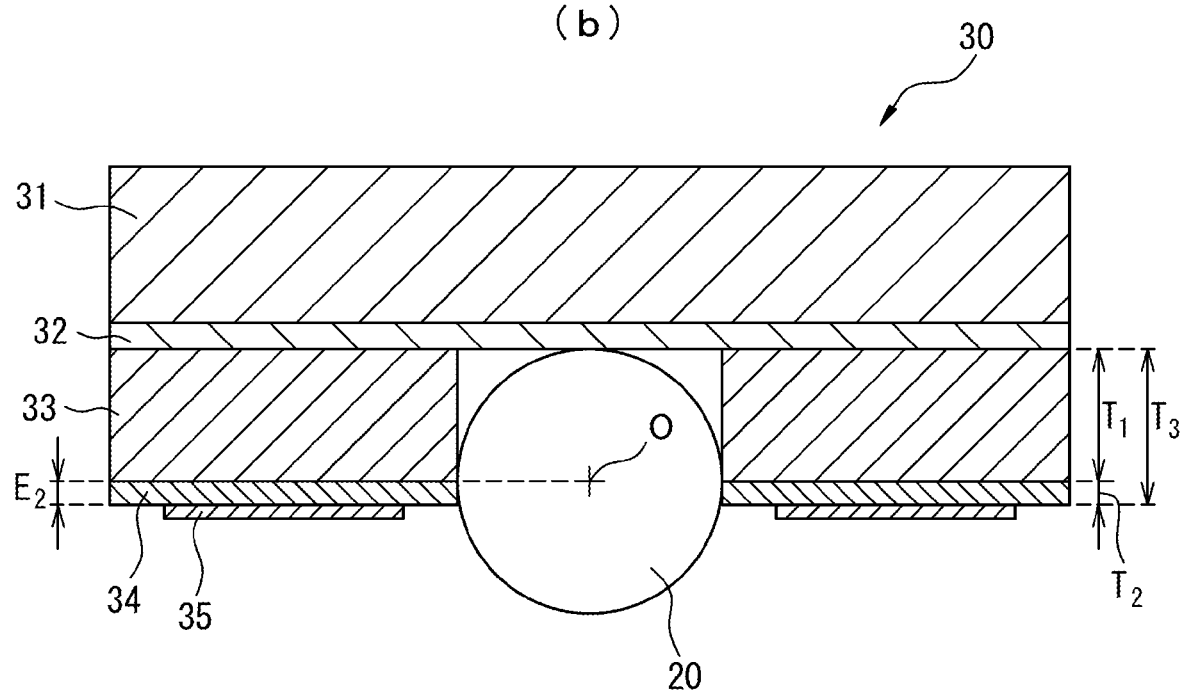

FIG. 5
(a)
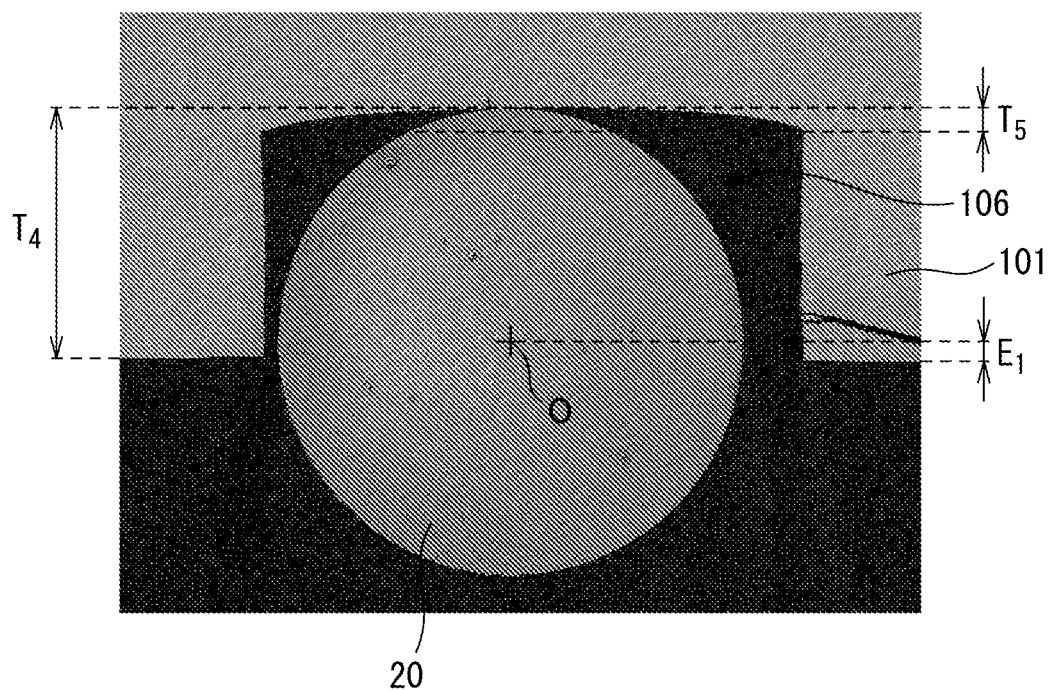
(b)
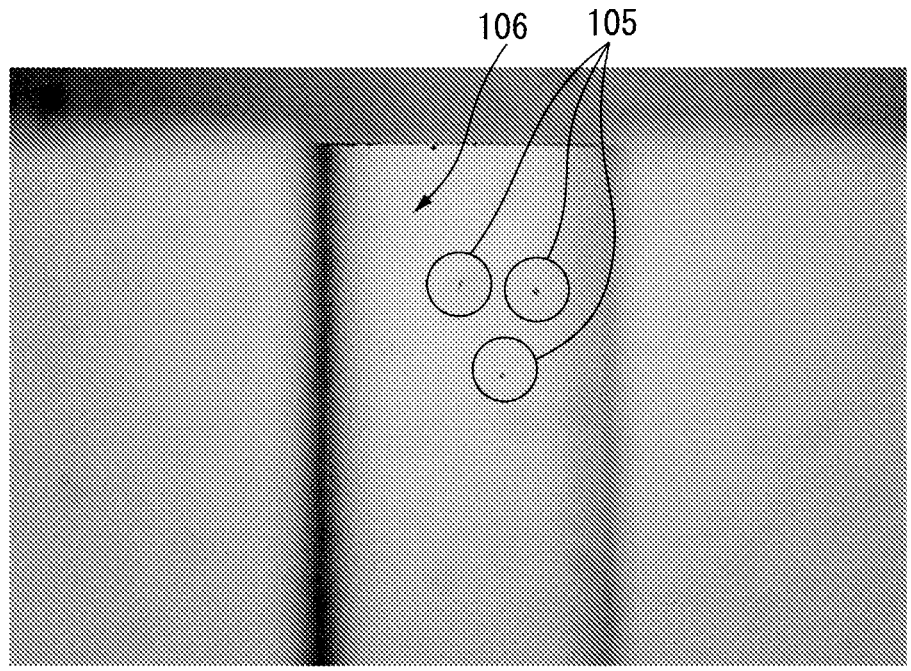

OPTICAL MODULE AND METHOD FOR FABRICATING OPTICAL MODULE

CROSS-REFERENCES TO RELATED APPLICATIONS

This application is a new U.S. patent application that claims benefit of JP 2012-137219, filed on Jun. 18, 2012, the entire content of JP 2012-137219 is hereby incorporated by reference.

TECHNICAL FIELD

The present invention relates to an optical module and a method for fabricating an optical module, and in particular to an optical module fabricated using a sub-substrate to which an optical fiber is fixed, and a method for fabricating such an optical module.

BACKGROUND

When attaching an optical fiber to a substrate, forming a V-shaped groove in an SOI substrate by photolithographic etching and to place the optical fiber into the V-shaped groove is known, thereby accurately positioning the optical fiber with respect to a SOI substrate (for example, refer to JP-2002-107508-A (FIGS. 1 and 3)).

SUMMARY

However, in the case of a V-shaped groove, if the opening defined in the resist for forming the V-shaped groove is not accurate enough, the depth of the V-shaped groove may vary, and the position of the V-shaped groove relative to the substrate may become displaced; therefore, it has been difficult to accurately position the optical fiber with respect to the substrate.

Another difficulty has been that once the optical fiber is placed into the V-shaped groove formed in the substrate, it is no longer possible to move the position of the optical fiber to adjust the center alignment.

Accordingly, it is an object of the present invention to provide an optical module that overcomes the above difficulties, and a method for fabricating such an optical module.

It is also an object of the present invention to provide an optical module that makes it possible to very accurately align an optical fiber with an optical device by using a sub-substrate to which the optical fiber is fixed, and a method for fabricating such an optical module.

The invention provides an optical module includes a silicon substrate; a sub-substrate which includes a support layer, an active layer, a BOX layer interposed between the support layer and the active layer, and a height adjusting layer, an optical fiber, and an optical device which is fixed to the silicon substrate, wherein the sub-substrate includes a fixing groove formed by the active layer and the BOX layer, the optical fiber is fixed to the fixing groove, and the optical fiber is optically coupled to the optical device by positioning the sub-substrate via the height adjusting layer with respect to the silicon substrate.

Preferably, in the optical module, the sub-substrate further includes a bonding Au layer formed on top of the height adjusting layer, and the silicon substrate includes an Au micro-bump structure for bonding to the bonding Au layer.

The invention also provides an optical module fabrication method that includes the steps of processing a base member having a support layer, an active layer, and a BOX layer interposed between the support layer and the active layer, and removing a portion of the active layer by etching, thereby fabricating the sub-substrate having a fixing groove formed by the active layer and the BOX layer, depositing, on top of the active layer, a height adjusting layer for adjusting the height of the active layer; fixing an optical fiber to the fixing groove, and positioning the sub-substrate via the height adjusting layer with respect to the silicon substrate, thereby optically coupling the optical fiber to the optical device.

Preferably, the optical module fabrication method further comprises the steps of: depositing a bonding Au layer on top of the height adjusting layer; and forming an Au micro-bump structure on the silicon substrate for bonding to the bonding Au layer.

According to the optical module and the optical module fabrication method described above, since the optical fiber is fixed to the fixing groove formed by the active layer and the BOX layer in the sub-substrate, it is possible to very accurately align the position of the optical fiber in the height direction when bonding the sub-substrate to the silicon substrate.

According to the optical module and the optical module fabrication method described above, even when the thickness of the active layer in the sub-substrate is not uniform, since the nonuniformity in the thickness of the active layer can be compensated for by the height adjusting layer, it is possible to very accurately align the position of the optical fiber in the height direction when bonding the sub-substrate to the silicon substrate.

BRIEF DESCRIPTION OF THE DRAWINGS

These and other features and advantages of the present invention will be better understood by reading the following detailed description, taken together with the drawings wherein:

FIG. 4 is a diagram for explaining the fabrication accuracy of a sub-substrate.

FIG. 5 is a diagram showing an example of the fabrication of the optical module 1.

DESCRIPTION OF EMBODIMENTS

An optical module and an optical module fabrication method according to the present invention will be described below with reference to the drawings. It will, however, be noted that the technical scope of the present invention is not limited to the specific embodiment described herein but extends to the inventions described in the appended claims and their equivalents.

Figure 1:
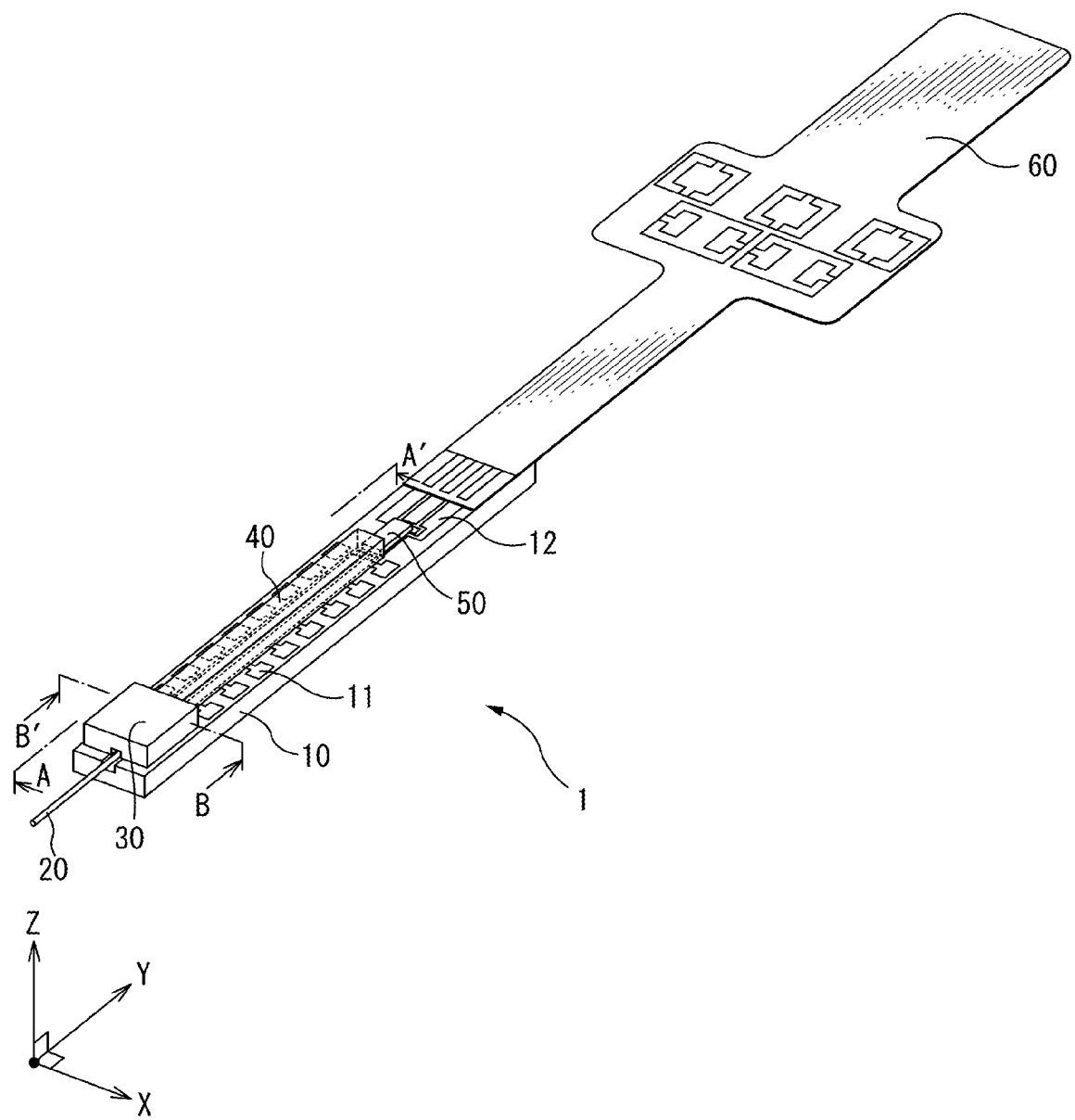
FIG. 1 is an external perspective view of an optical module 1.
Figure 2:
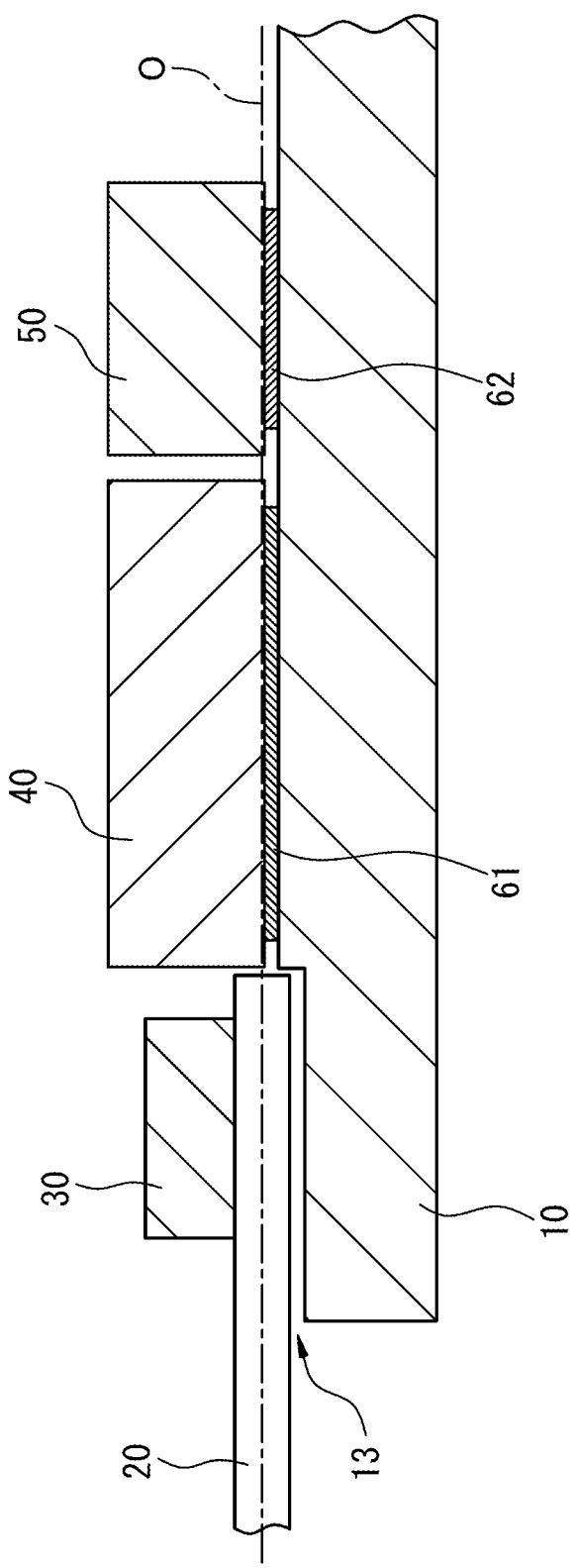
FIG. 2 is a schematic cross-sectional view taken along line AA' in FIG. 1.

FIG. 1 is an external perspective view of an optical module 1, and FIG. 2 is a schematic cross-sectional view taken along line AA' in FIG. 1.

The optical module 1 comprises a silicon substrate 10, an optical fiber 20, a sub-substrate 30 to which the optical fiber 20 is to be attached, a PPLN (Periodically Poled Lithium Niobate) device 40 for optical wavelength conversion, an LD (Laser Diode) device 50, and a flexible substrate 60 for supplying a drive voltage and/or a control voltage to the LD device 50.

In FIG. 1, the silicon substrate 10 is provided with a first electrode 11 for supplying a drive voltage and/or a control voltage to a heater (not shown) used to control the temperature of the PPLN device 40 and a second electrode 12 for connecting the LD device 50 with the flexible substrate 60. A recess 13 is formed in the silicon substrate 10 so that the optical fiber 20 fixed to the sub-substrate 30 does not contact the silicon substrate 10.

For example, the optical module 1 can be configured to function as a laser light source in which single-mode near-infrared laser light of 1064-nm wavelength emitted from the LD device 50 is converted by the PPLN device 40 into 532-nm green laser light for output. When the optical module 1 is configured to function as a laser light source, the green laser light output from the PPLN device 40 is propagated through the optical fiber 20 fixed to the sub-substrate 30.

In the optical module 1, the PPLN device 40 is optically coupled to the optical fiber 20 so that the light emitted from the LD device 50 and wavelength-converted by the PPLN device 40 can be efficiently coupled into the optical fiber 20. Further, as will be described later, in order to enhance the optical coupling efficiency, the PPLN device 40 and the optical fiber 20 are aligned relative to each other with a very high accuracy of submicron order. The optical coupling in this context means that the relative positions are determined so that the light emitted from one optical device can be directly coupled into the optical fiber.

When assembling the optical module 1, registration marks such as alignment marks are provided on the silicon substrate 10 and, by reference to such registration marks, the sub-substrate 30 with the optical fiber 20 fixed thereon and the PPLN device 40 are mounted by a mounting apparatus (not shown) onto the silicon substrate 10.

When the sub-substrate 30 and the PPLN device 40 are mounted on the silicon substrate 10 in the above manner, the alignment in the plane (in the XY directions) of the silicon substrate 10 can be accomplished with very high accuracy. However, the alignment accuracy in the height direction (Z direction) depends on how the sub-substrate 30 and the PPLN device 40 are mounted on the silicon substrate 10.

In view of the above, provisions are made in the optical module 1 so that the distance from the reference position of the optical fiber 20 fixed to the sub-substrate 30 (for example, the center O of the optical fiber 20 or the position at which the optical fiber 20 contacts a BOX layer 32) to the bottom surface of the sub-substrate 30 can be constantly maintained at a predetermined value, as will be described later. With such provisions, it is possible to accurately identify the height of the reference position of the optical fiber 20 relative to the silicon substrate 10 when the sub-substrate 30 is mounted on the silicon substrate 10.

Figure 3:
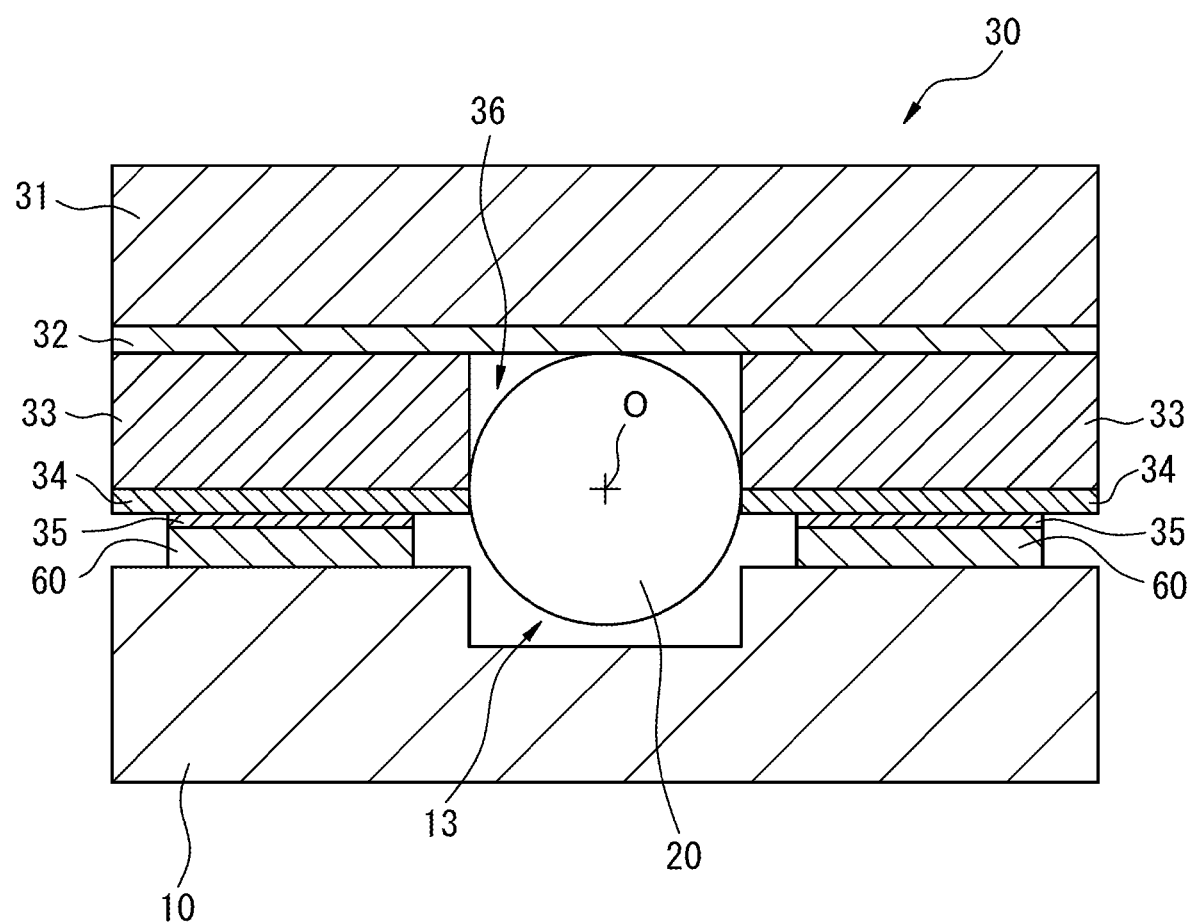
FIG. 3 is a schematic cross-sectional view taken along line BB' in FIG. 1.

FIG. 3 is a schematic cross-sectional view taken along line BB' in FIG. 1.

FIG. 3 shows the condition in which the optical fiber 20 fixedly bonded to the sub-substrate 30 with a resin is mounted on the silicon substrate 10. As earlier described, when the sub-substrate 30 is mounted on the silicon substrate 10, the optical fiber 20 does not contact the silicon substrate 10 due to the presence of the recess 13 formed in the silicon substrate 10. The cross-sectional shape of the recess 13 is rectangular, as shown in FIG. 3, but it may be formed in some other suitable shape.

The sub-substrate 30 comprises a support layer 31 formed from SOI, a BOX layer 32 formed from a SiO2 insulating layer, an active layer 33, a height adjusting layer 34 formed from SiO2, a bonding Au layer 35 for surface activated bonding to the silicon substrate 10, and a fixing groove 36 for fixing the optical fiber 20.

A micro-bump structure 60 of Au is formed on the silicon substrate 10. Accordingly, by merely bringing the bonding Au layer 35 of the sub-substrate 30 into contact with the surface of the surface-activated micro-bump structure 60, the sub-substrate 30 is surface-activated bonded to the micro-bump structure 60 and thus fixed to the silicon substrate 10.

The micro-bump structure 60 is formed by arranging a plurality of tiny columnar bumps, each 2 μm in height and 5 μm in diameter, equally spaced from left to right at a pitch of 10 to 25 μm. The bump shape, height, width, pitch, etc. are only examples, and are not limited to those described above. The micro-bump structure 60 is formed by sputtering or evaporation, and the heights of the bumps are precisely equal across the entire area.

The surface activation is performed by treating the surface of the micro-bump structure 60 and the surface of the bonding Au layer 35 by plasma cleaning. Since atoms having high surface energy can be made to contact each other by surface activation, the surfaces can be firmly bonded together by utilizing the adhesion forces acting between the atoms. Since this bonding method does not require any special heating, the method offers the advantages of reducing the chance of component breakage that could occur due to the residual stress arising from the difference in thermal expansion coefficient, and reducing the chance of component functional degradation because no stress is applied to the components.

While FIG. 3 has shown an example in which the sub-substrate 30 is surface-activated bonded by using the bonding Au layer 35 and the micro-bump structure 60, the method for bonding the sub-substrate 30 to the silicon substrate 10 is not limited to the surface activated bonding, but other suitable bonding methods may be used.

Further, as shown in FIG. 2, the PPLN device 40 is surface-activated bonded to the silicon substrate 10 by using a second Au micro-bump structure 61 formed on the silicon substrate 10 and a second bonding Au layer (not shown) formed on the PPLN device 40. Similarly, the LD device 50 is surface-activated bonded to the silicon substrate 10 by using a third Au micro-bump structure 62 formed on the silicon substrate 10 and a third bonding Au layer (not shown) formed on the LD device 50. The second Au micro-bump structure 61 and the third Au micro-bump structure 62 are each identical in structure to the above-described micro-bump structure 60.

FIG. 4 is a diagram for explaining the fabrication accuracy of the sub-substrate. FIG. 4(a) shows a sub-substrate 100 fabricated by deep-etching a conventional silicon substrate by dry etching. FIG. 4(b) shows the sub-substrate 30 used in the optical module 1 (see FIG. 3).

The most important factor to be considered when mounting the sub-substrate 100 of FIG. 4(a) onto the silicon substrate 10 is the distance E1 between the reference position (for example, the center O) of the optical fiber 20 fixed to the sub-substrate 100 and the bottom surface of the sub-substrate 100.

FIG. 5(a) is a photograph showing a cross section of the actually fabricated sub-substrate 100.

As shown in FIG. 5(a), when deep etching is performed by dry etching, the upper portion of the optical fiber fixing groove 106 is curved as a result of etching (see the height T5 of the curved portion). Furthermore, the degree of curving varies depending on the dry etching conditions and, since the dry etching rate is fast, it is not easy to control the height T5 of the curved portion. It is therefore difficult to highly accurately control the height T4 from the bottom surface of the sub-substrate 100 to the uppermost portion of the optical fiber 20. As a result, it has not been easy to accurately control the distance E1 between the reference position (for example, the center O) of the optical fiber 20 fixed to the sub-substrate 100 and the bottom surface of the sub-substrate 100 to a predetermined desired value.

FIG. 5(b) is a photograph showing the interior of the optical fiber fixing groove 106 formed in the actually fabricated sub-substrate 100. Indicated at 105 in FIG. 5(b) are portions where protrusions are formed as a result of etching. In the case of deep etching performed by dry etching, the protrusions 105 may be formed as shown in FIG. 5(b), and since this causes a displacement in the position where the optical fiber 20 is fixed to the sub-substrate 100, the distance E1 between the reference position (for example, the center O) of the optical fiber 20 fixed to the sub-substrate 100 and the bottom surface of the sub-substrate 100 cannot be accurately controlled to the predetermined desired value.

In contrast, in the case of the sub-substrate 30 of FIG. 4(b) used in the optical module 1, the distance E2 between the reference position (for example, the center O) of the optical fiber 20 fixed to the sub-substrate 30 and the bottom surface of the sub-substrate 30 can be constantly controlled to the desired value with high accuracy. Compared with the sub-substrate 100 shown in FIGS. 4(a) and 5, the sub-substrate 30 of FIG. 4(b) can be fabricated with high accuracy because of the provision of the BOX layer 32 and the height adjusting layer 34.

The BOX layer 32 acts as an etch stop layer and prevents the support layer 31 from being eroded by etching. More specifically, since the position where the uppermost portion of the optical fiber 20 contacts the sub-substrate 30 does not change as a result of etching, the distance between the reference position (for example, the center O) of the optical fiber 20 and the bottom surface of the sub-substrate 30 can be accurately controlled to the desired value with high accuracy.

On the other hand, the thickness of the active layer 33 may vary from lot to lot of the SOI wafer used. If the thickness of the SOI wafer varies, the distance between the reference position (for example, the center O) of the optical fiber 20 and the bottom surface of the sub-substrate 30 also varies. Therefore, in the sub-substrate 30, the height adjusting layer 34 is used to compensate for the variation in the thickness of the active layer 33.

Thus, in the sub-substrate 30, the height T3 from the bottom surface of the sub-substrate 30 to the uppermost portion of the optical fiber 20 can be very accurately controlled by the BOX layer 32 and the height adjusting layer 34. In FIG. 4(b), for convenience of comparison with FIG. 4(a), the presence of the Au layer 35 is not considered, but the above description applies equally as well if the presence of the Au layer 35 is considered.

Since provisions are made to be able to very accurately maintain the positional relationship between the reference position (for example, the center O) of the optical fiber 20 fixed to the sub-substrate 30 and the bottom surface of the sub-substrate 30, as described above, the reference position of the optical fiber 20 fixed to the sub-substrate 30 can be aligned very accurately with the reference position (for example, the laser light emitting position) of the PPLN device 40 bonded in advance to the silicon substrate 10. More specifically, since the micro-bump structure 60 and the second Au micro-bump structure 61 are both designed to be compressed by a prescribed amount when a load is applied from above, the optical coupling between the PPLN device 40 and the optical fiber 20 fixed to the sub-substrate 30 can be accomplished with an accuracy of submicron order by causing the PPLN device 40 to emit laser light and by finely adjusting the height position by applying a load to the sub-substrate 30 while measuring the amount of laser light propagated through the optical fiber 20.

Thus, with the provision of the BOX layer 32 and the height adjusting layer 34, very accurate center alignment at the time of surface activated bonding can be easily achieved without being affected by variations in the thickness of the SOI wafer.

Figure 6:
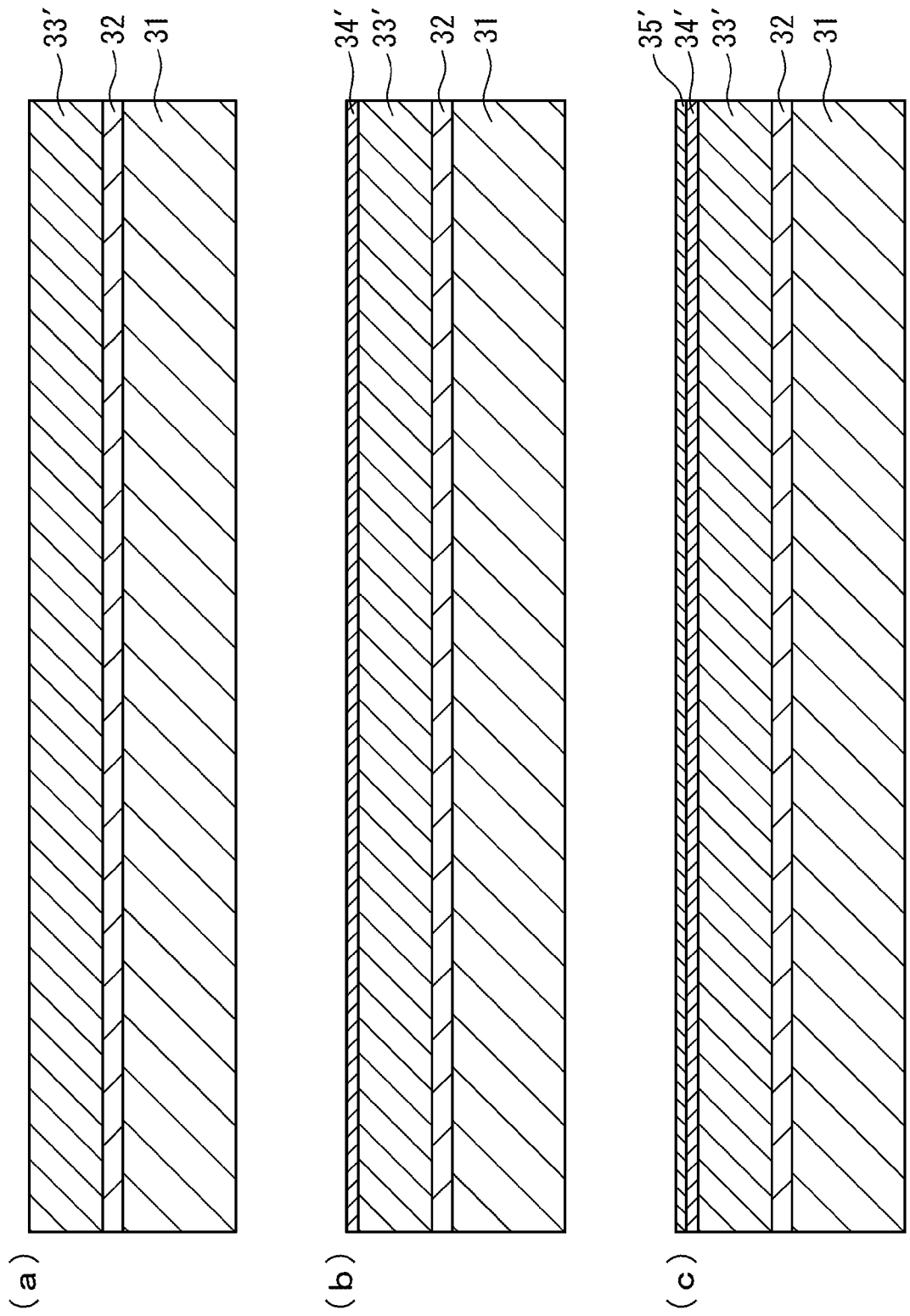
FIG. 6 is a diagram (part 1) showing the fabrication process of the optical module 1.
Figure 7:
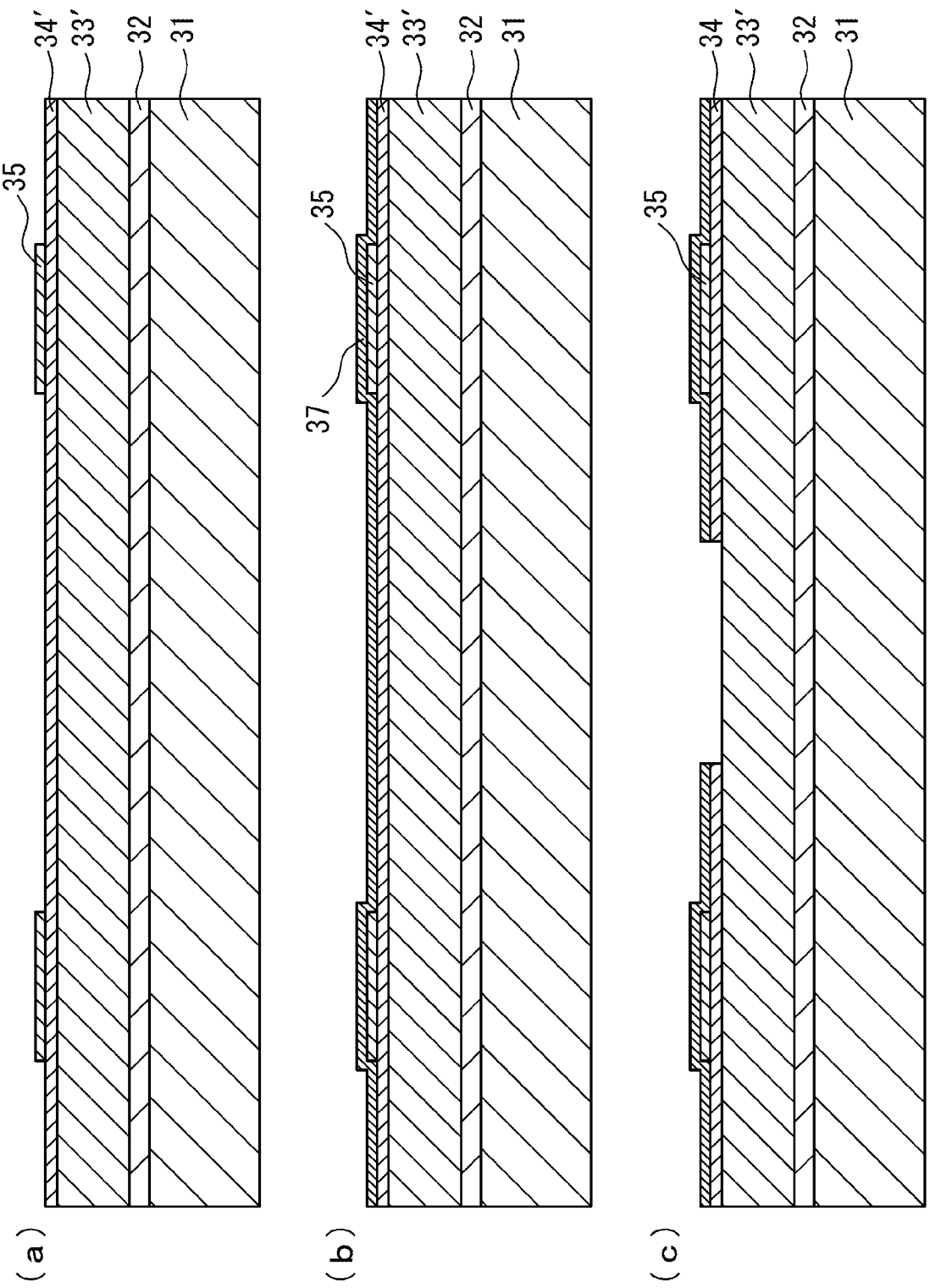
FIG. 7 is a diagram (part 2) showing the fabrication process of the optical module 1.
Figure 8:
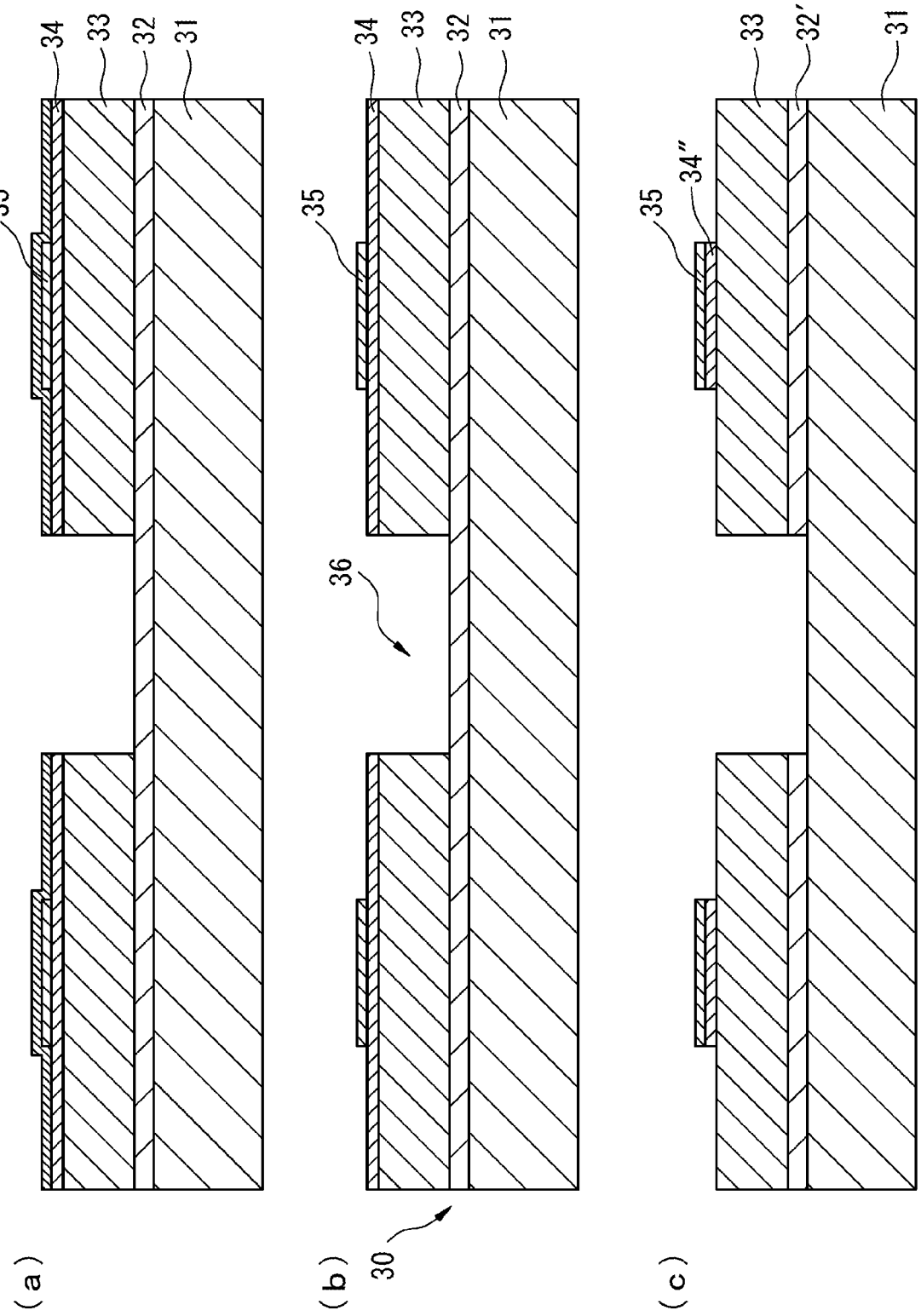
FIG. 8 is a diagram (part 3) showing the fabrication process of the optical module.

FIGS. 6 to 8 are diagrams for explaining the fabrication process of the optical module 1. The following description deals mainly with the fabrication steps of the sub-substrate 30 in the fabrication process of the optical module 1 with reference to FIGS. 6 to 8.

First, an SiO2 insulating layer 32' that forms the BOX layer is deposited on the support layer 31 and, on top of that, an SOI wafer as a substrate of a three-layer structure with an active layer 33' formed therein is prepared (see FIG. 6(a)). The SiO2 insulating layer 32' is deposited to a thickness of 2 μm.

Next, a height adjusting SiO2 layer 34' that forms the height adjusting layer 34 is deposited to a desired thickness which varies depending on the thickness of the active layer 33'. More specifically, the height adjusting SiO2 layer 34' is deposited while adjusting its thickness in 0.2-μm increments so that the combined thickness of the active layer 33' and the height adjusting layer 34 will become equal to 60 μm (see FIG. 6(b)). Preferably, the thickness of the height adjusting SiO2 layer 34' is from 0.2 μm to 2.0 μm.

Next, an Au layer 35' that forms the bonding Au layer 35 for bonding to the silicon substrate 10 is deposited by evaporation on the height adjusting SiO2 layer 34' (see FIG. 6(c)).

Subsequently, the Au layer 35' is patterned by photolithographic trimming, to form the bonding Au layer 35 for bonding to the silicon substrate 10 (see FIG. 7(a)).

Next, a resist 37 for forming the optical fiber fixing groove 36 is formed (see FIG. 7(b)), and using a predefined mask, the resist 37 is removed from the area where the optical fiber fixing groove 36 is to be formed.

Then, using a solution of hydrofluoric acid, the height adjusting SiO2 layer 34' is removed from the area where the optical fiber fixing groove 36 is to be formed (see FIG. 7(c)).

Next, the SOI wafer 33' exposed in the area where the optical fiber fixing groove 36 is to be formed is etched off by using the method of dry lithography (see FIG. 8(a)). During the etching, since the BOX layer 32 acts as an etch stop layer for stopping the etching from proceeding further, the support layer 31 is prevented from being concaved by etching. This completes the formation of the optical fiber fixing groove 36 with its three sides enclosed by the active layer 33 and the BOX layer 32.

Next, the resist 37 is removed using a prescribed chemical agent, to complete the fabrication of the sub-substrate 30 (see FIG. 8(b)). The optical fiber 20 is fixed to the thus completed sub-substrate 30, and the sub-substrate 30 with the optical fiber 20 fixed thereon, the PPLN device 40, the LD device 50, and the flexible substrate 60 are mounted onto the silicon substrate 10, completing the fabrication of the optical module 1.

From the condition shown in FIG. 8(b), the BOX layer 32 exposed in the optical fiber fixing groove 36 may be removed by hydrofluoric acid wet etching (see FIG. 8(c)). In this case, the height adjusting layer 34 is also etched away everywhere except where it is protected by the bonding Au layer 35, resulting in the formation of a height adjusting layer 34". Since hydrofluoric acid wet etching does not affect the support layer 31 formed from the SOI substrate, there is no possibility of the etching process causing the portion thereof exposed in the optical fiber fixing groove 36 to be etched in a curved shape. Furthermore, since removing the BOX layer 32 exposed in the optical fiber fixing groove 36 also results in removing any dirt, protrusions, etc., formed on the surface of the BOX layer 32, the optical fiber 20 can be fixed to the sub-substrate 30 with higher accuracy.

The above fabrication process may be modified so that the height adjusting layer 34 and the bonding Au layer 35 are formed after the optical fiber fixing groove 36 has been formed by etching.

The above has described the optical module 1 that makes it possible to highly accurately align the optical fiber 20 with the PPLN device 40. However, the optical module according to the present invention is not to be construed as being limited to the above specific optical module 1, but can also be applied advantageously where the optical fiber 20 is to be aligned with an optical device other than the PPLN device 40.

What is claimed is:

1. An optical module comprising:
   a silicon substrate;
   a sub-substrate which includes a support layer, an active layer, a BOX layer interposed between said support layer and said active layer, and a height adjusting layer;
   an optical fiber; and
   an optical device which is fixed to said silicon substrate, wherein
   said sub-substrate includes a fixing groove formed by said active layer and said BOX layer,
   said optical fiber is fixed to said fixing groove, and
   said optical fiber is optically coupled to said optical device by positioning said sub-substrate via said height adjusting layer with respect to said silicon substrate.

2. The optical module according to claim 1, wherein said sub-substrate further includes a bonding Au layer formed on top of said height adjusting layer, and
   said silicon substrate includes an Au micro-bump structure for bonding to said bonding Au layer.

3. A method for fabricating an optical module having a substrate and a sub-substrate and an optical device both bonded to said substrate, said method comprising the steps of:
   processing a base member having a support layer, an active layer, and a BOX layer interposed between said support layer and said active layer, and removing a portion of said active layer by etching, thereby fabricating said sub-substrate having a fixing groove formed by said active layer and said BOX layer;
   depositing, on top of said active layer, a height adjusting layer for adjusting the height of said active layer;
   fixing an optical fiber to said fixing groove; and
   positioning said sub-substrate via said height adjusting layer with respect to said silicon substrate, thereby optically coupling said optical fiber to said optical device.

4. The optical module fabrication method according to claim 3, further comprising the steps of:
   depositing a bonding Au layer on top of said height adjusting layer; and
   forming an Au micro-bump structure on said silicon substrate for bonding to said bonding Au layer.

* * * * *